(12) United States Patent
Wen et al.

(10) Patent No.: US 12,546,810 B2
(45) Date of Patent: Feb. 10, 2026

(54) TEST METHOD FOR IMPROVING IO DEVICE YIELD

(71) Applicant: Shanghai Huali Integrated Circuit Corporation, Shanghai (CN)

(72) Inventors: Jiacheng Wen, Shanghai (CN); Zhi Tian, Shanghai (CN); Tao Liu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 128 days.

(21) Appl. No.: 18/617,805

(22) Filed: Mar. 27, 2024

(65) Prior Publication Data
US 2024/0353468 A1    Oct. 24, 2024

(30) Foreign Application Priority Data

Apr. 23, 2023    (CN) .......................... 202310443085.X

(51) Int. Cl.
*G01R 31/26*    (2020.01)
*H03K 17/687*    (2006.01)

(52) U.S. Cl.
CPC ....... *G01R 31/2607* (2013.01); *H03K 17/687* (2013.01)

(58) Field of Classification Search
CPC .......................... G01R 31/2607; H03K 17/687
See application file for complete search history.

(56) References Cited

U.S. PATENT DOCUMENTS

| 6,946,865 B2 * | 9/2005 | Mizuno | H03K 19/0016 324/762.02 |
| 7,235,997 B2 * | 6/2007 | Huang | G01R 31/275 324/762.09 |
| 9,970,980 B2 * | 5/2018 | Bodano | G01R 31/2621 |
| 2016/0216313 A1 * | 7/2016 | Ogawa | G11C 29/50 |
| 2024/0385235 A1 * | 11/2024 | Ishii | G01R 31/2608 |

* cited by examiner

*Primary Examiner* — Reena Aurora
(74) *Attorney, Agent, or Firm* — Banner & Witcoff, Ltd.

(57) ABSTRACT

The present application discloses a device leakage current test method. The method includes: applying a gradually increasing first gate voltage within a range to a gate of the MOS transistor; applying a first drain voltage to a drain of the MOS transistor; reapplying a gradually increasing second gate voltage within a range to the gate of the MOS transistor; reapplying a second drain voltage to the drain of the MOS transistor; reapplying a gradually increasing third drain voltage in a range to the drain of the MOS transistor; detecting a variation of the drain current as the first leakage current; and reapplying a gradually increasing fourth drain voltage to the drain of the MOS transistor, with a step of 0.04 V and a variation range; and detecting a variation of the drain current as the second leakage current.

8 Claims, 2 Drawing Sheets

---

Step I. Provide a device comprising a MOS, applying a gradually increasing first gate voltage to a gate of the MOS in the device, the first gate voltage varying with a step of 0.1 V, and the first gate voltage varying in a range of -2 V to 8 V; and apply a first drain voltage of 0.05 V to a drain of the MOS in the device

↓

Step II. Reapply a gradually increasing second gate voltage to the gate of the MOS, the second gate voltage varying with a step of 0.1 V, and the second gate voltage varying in a range of -2 V to 8 V; and reapply a second drain voltage of 8 V to the drain of the MOS

↓

Step III. Reapply a gradually increasing third drain voltage to the drain of the MOS, the third drain voltage varying with a step of 0.04 V, and the third drain voltage varying in a range of 0 V to 14 V; and detect a variation of a drain current that occurs as the third drain voltage varies, the drain current being a first leakage current

↓

Step IV. Reapply a gradually increasing fourth drain voltage to the drain of the MOS, the fourth drain voltage varying with a step of 0.04 V, and the fourth drain voltage varying in a range of 0 V to 14 V; and detect a variation of the drain current that occurs as the fourth drain voltage varies, the drain current being a second leakage current, wherein when variation ranges of the fourth drain voltage and the third drain voltage are each greater than 8 V and less than 12 V, the second leakage current is less than the first leakage current

TEST METHOD FOR IMPROVING IO DEVICE YIELD

CROSS-REFERENCE TO RELATED APPLICATIONS

This application claims priority to Chinese patent application No. 202310443085.X, filed on Apr. 23, 2023, the disclosure of which is incorporated herein by reference in its entirety.

TECHNICAL FIELD

The present application relates to the technical field of semiconductors, and in particular, to a test method for improving an IO device yield.

BACKGROUND

Currently, an array structure of an 8 V NMOS transistor device is used frequently in 28 nm display driver integrated circuit (DDIC) product chips for an OLED display driving function. A leakage of the device itself imposes a critical impact on the use of a display product. Generally, the leakage is analyzed during a product yield test evaluation after shipment. A source-to-drain leakage current test item is to check a leakage status of a relevant IO device array structure to analyze whether the yield is up to standard.

A pin-to-pin leakage of an IO device that causes the yield to be not up to standard may result from the existence of a trap charge in the structure, which leads to an excessively large leakage current of the device during operation. At present, a mainstream approach is to analyze and improve the performance of the device itself. Optimization of the physical structure of the device is common, which, however, brings up the following problem: increasing the product development cycle, thereby increasing the economic cost inevitably and causing a loss in the market competitiveness. Furthermore, applying a current to the drain of the device at a breakdown voltage only leads to a non-significant improvement effect or no improvement effect. Accordingly, it is necessary to propose a new method to solve the above problem from such IO device leakage current which is the cause of a low yield.

BRIEF SUMMARY

The present application provides a test method for improving an IO device yield.

The test method for improving the IO device yield according to the present application, at least includes:
step I, providing a device comprising a MOS transistor, applying a gradually increasing first gate voltage to a gate of the MOS transistor in the IO device, the first gate voltage varying with a step of 0.1 V, and the first gate voltage varying in a range of −2 V to 8 V; and applying a first drain voltage of about 0.05 V to a drain of the MOS transistor in the IO device;
step II, reapplying a gradually increasing second gate voltage to the gate of the MOS transistor, the second gate voltage varying with a step of 0.1 V, and the second gate voltage varying in a range of −2 V to 8 V; and reapplying a second drain voltage of 8 V to the drain of the MOS transistor;
step III, reapplying a gradually increasing third drain voltage to the drain of the MOS transistor, the third drain voltage varying with a step of 0.04 V, and the third drain voltage varying in a range of 0 V to 14 V; and detecting a variation of a drain current that occurs as the third drain voltage varies, the drain current being a first leakage current; and
step IV, reapplying a gradually increasing fourth drain voltage to the drain of the MOS transistor, the fourth drain voltage varying with a step of 0.04 V, and the fourth drain voltage varying in a range of 0 V to 14 V; and detecting a variation of the drain current that occurs as the fourth drain voltage varies, the drain current being a second leakage current, wherein when variation ranges of the fourth drain voltage and the third drain voltage are each greater than 8 V and less than 12 V, the second leakage current is less than the first leakage current.

In an example, voltages of a source and a base of the MOS transistor in the IO device in step I are each 0 V.

In an example, voltages of a source and a base of the MOS transistor in the IO device in step II are each 0 V.

In an example, a critical value of the drain current of the MOS transistor in step III is 1E-6 A.

In an example, voltages of a source, a base, and the gate of the MOS transistor in step III are each 0 V.

In an example, a critical value of the drain current of the MOS transistor in step IV is 1E-6 A.

In an example, when the third drain voltage in step III and the fourth drain voltage in step IV are each 8 V, the first leakage current is equal to the second leakage current, both being 1E-11 A.

In an example, the method further comprises step V: repeating step IV multiple times, so as to obtain a drain current that varies in consistency with the second leakage current.

As stated above, the test method for improving an IO device yield of the present application has the following beneficial effects: by applying a current effect to the drain of the IO device, the present application restricts a current to act on the IO device continuously, which may effectively eliminate the possible presence of trap electrons in the structure and reduce the leakage current of the IO device, thereby reducing power consumption during use and improving the product yield.

DETAILED DESCRIPTION OF THE DISCLOSURE

The embodiments of the present application are described below using specific examples, and those skilled in the art could readily understand other advantages and effects of the present application from the contents disclosed in the specification. The present application may also be implemented or applied using other different specific implementations, and various details in the specification may also be modified or changed based on different viewpoints and applications without departing from the spirit of the present application.

Figure 1:
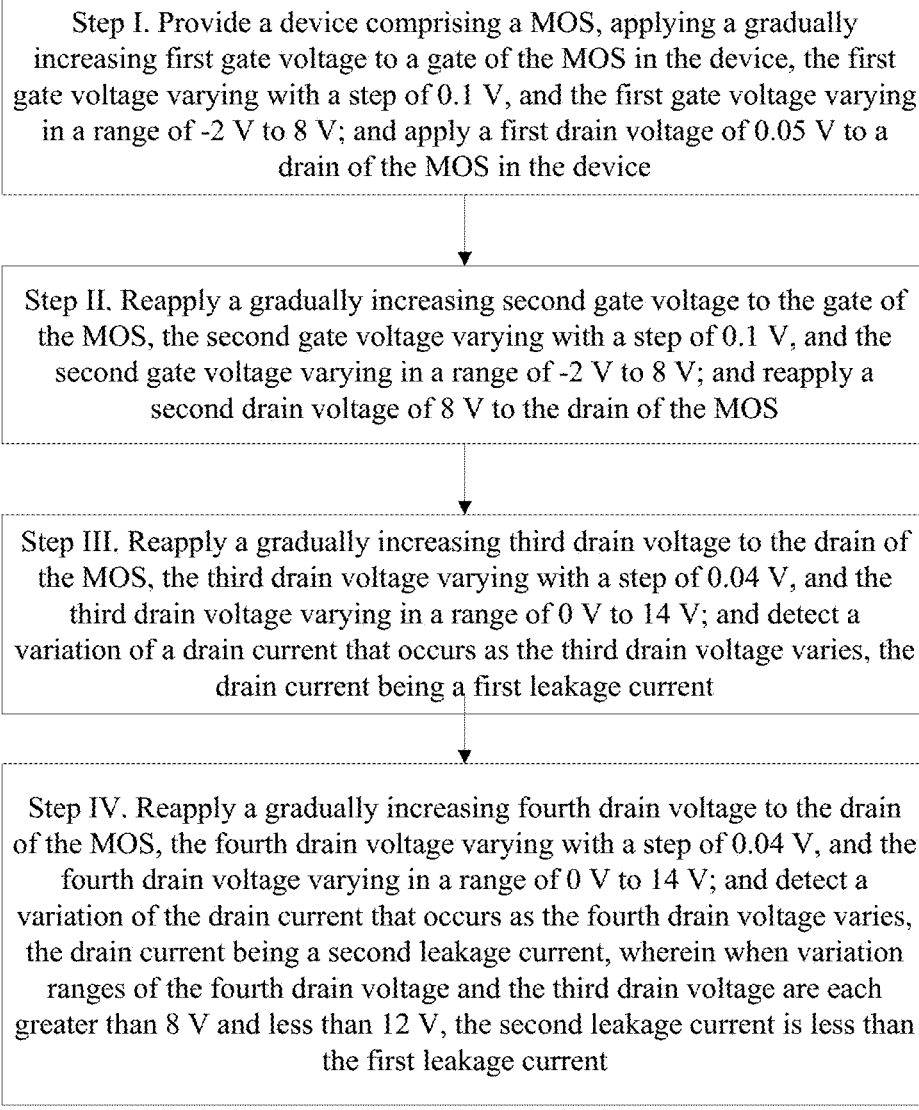
FIG. 1 illustrates a flowchart of a test method for improving an IO device yield according to the present application.
Figure 2:
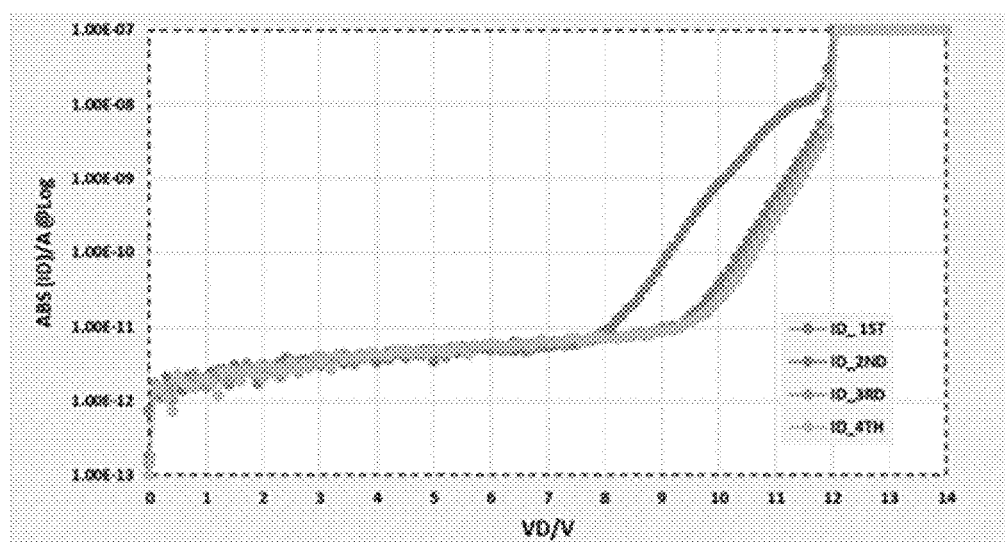
FIG. 2 shows a data chart comparing leakage current curves which vary as a function of drain voltage according to the present application.

Please refer to FIGS. 1-2. It should be noted that the drawings provided in the embodiments are only intended to illustrate the basic concept of the present application in a schematic way, so the drawings only show the components related to the present application rather than being drawn according to the number, shape, and size of the components in actual implementations. The type, number, and proportion of various components can be changed largely in the actual implementations, and the layout of the components may be even more complicated.

The present application provides a test method for improving an IO device yield. Referring to FIG. 1, FIG. 1 illustrates a flowchart of the test method for improving an IO device yield according to the present application, the method at least includes the following steps.

Step I. A device including a MOS transistor is provided, a gradually increasing first gate voltage is applied to a gate of the MOS transistor in the IO device, the first gate voltage varying with a step of 0.1 V, in a range from −2 V to 8 V; and a first drain voltage of about 0.05 V is applied to the drain of the MOS transistor in the IO device. In this embodiment of the present application, voltages of the source and the base of the MOS transistor in the IO device in step I are each set at 0 V.

In step I, the gradually increasing first gate voltage $Vg1$ is applied to the gate of the MOS transistor in the IO device, the first gate voltage $Vg1$ varying with the step of 0.1 V, i.e., step=0.1 V, and in the range from −2 V to 8 V; and the first drain voltage $Vd1$ of about 0.05 V is applied to the drain of the MOS transistor in the IO device. In this embodiment of the present application, the voltages of the source and the base of the MOS transistor in the IO device in step I are each set at 0 V, i.e., $Vs=Vb$.

Step II. A gradually increasing second gate voltage is reapplied to the gate of the MOS transistor, the second gate voltage varying with a step of 0.1 V in a range from −2 V to 8 V; and a second drain voltage of 8 V is reapplied to the drain of the MOS transistor. In this embodiment of the present application, voltages of a source and a base of the MOS transistor in the IO device in step II are each set at 0 V.

In step II, the gradually increasing second gate voltage $Vg2$ is reapplied to the gate of the MOS transistor, the second gate voltage $Vg2$ varying with the step of 0.1 V, i.e., step=0.1 V, and in the range from −2 V to 8 V; and the second drain voltage $Vd2$ of 8 V is reapplied to the drain of the MOS transistor. In this embodiment of the present application, the voltages of the source and the base of the MOS transistor in the IO device in step II are each set at 0 V, i.e., $Vs=Vb$.

Step III. A gradually increasing third drain voltage is reapplied to the drain of the MOS transistor, the third drain voltage varying with a step of 0.04 V, and in a range from 0 V to 14 V; and a variation of a drain current that occurs as the third drain voltage varies is detected, the drain current being a first leakage current. In this embodiment of the present application, a critical value of the drain current of the MOS transistor in step III is 1E-6 A. In this embodiment of the present application, voltages of a source, a base, and the gate of the MOS transistor in step III are each set at 0 V.

In step III, the gradually increasing third drain voltage $Vd3$ is reapplied to the drain of the MOS transistor, the third drain voltage $Vd3$ varying with the step of 0.04 V, i.e., step=0.04 V, and in the range from 0 V to 14 V; and the variation of the drain current that occurs as the third drain voltage varies is detected, the drain current being the first leakage current $Id1$. In this embodiment, the critical value of the drain current of the MOS transistor in step III is 1E-6 A. In this embodiment, the voltages of the source, the base, and the gate of the MOS transistor in step III are each set at 0 V.

Step IV. A gradually increasing fourth drain voltage is reapplied to the drain of the MOS transistor, the fourth drain voltage varying with a step of 0.04 V, and in a range from 0 V to 14 V; and a variation of the drain current that occurs as the fourth drain voltage varies is detected, the drain current being a second leakage current, wherein when variation ranges of the fourth drain voltage and the third drain voltage are each greater than 8 V and less than 12 V, the second leakage current is less than the first leakage current. In this embodiment of the present application, a critical value of the drain current of the MOS transistor in step IV is 1E-6 A. The critical value indicates that the IO device will be damaged when the drain current of the IO device exceeds 1E-6 A. That is, the drain current of the IO device operating normally is required to be less than the critical value. In this embodiment of the present application, when the third drain voltage in step III and the fourth drain voltage in step IV are each set at 8 V, the first leakage current is equal to the second leakage current, both being about 1E-11 A.

In step IV, the gradually increasing fourth drain voltage $Vd4$ is reapplied to the drain of the MOS transistor, the fourth drain voltage $Vd4$ varying with the step of 0.04 V, i.e., step=0.04 V, and in the range from 0 V to 14 V; and the variation of the drain current that occurs as the fourth drain voltage $Vd4$ varies is detected, the drain current being the second leakage current $Id2$, wherein when variation ranges of the fourth drain voltage $Vd4$ and the third drain voltage $Vd3$ are each greater than 8 V and less than 12 V, the second leakage current $Id2$ is less than the first leakage current $Id1$. In this embodiment of the present application, the critical value of the drain current of the MOS transistor in step IV is 1E-6 A. The critical value indicates that the IO device will be damaged when the drain current of the IO device exceeds 1E-6 A. That is, the drain current of the IO device operating normally is required to be less than the critical value. In this embodiment of the present application, when the third drain voltage $Vd3$ in step III and the fourth drain voltage $Vd4$ in step IV are each set at 8 V, the first leakage current $Id1$ is equal to the second leakage current $Id2$, both being 1E-11 A. That is, step IV reduces trap charges in the IO device on the basis of step III, thereby reducing the leakage current.

In this embodiment of the present application, the method further includes step V: repeating step IV multiple times, so as to obtain a drain current that varies in consistency with the second leakage current.

Referring to FIG. 2, FIG. 2 shows a data chart comparing leakage current curves which vary as a function of drain voltage according to the present application. The horizontal axis represents the drain voltage VD in volts (V) and the vertical axis represents the drain current ID expressed as absolute value of ID in Ampere (A) in Log scale. The curve ID_1ST refers to a curve of the first leakage current $Id1$ varying as the third drain voltage $Vd3$ varies; a curve ID_2ND refers to a curve of the second leakage current $Id2$ varying as the fourth drain voltage $Vd4$ varies; a curve ID_3RD refers to a curve of the drain current varying as the fourth drain voltage $Vd4$ varies, which is obtained by repeating step IV for the first time in step V in this embodiment; a curve ID_4TH refers to a curve of the drain current varying as the fourth drain voltage $Vd4$ varies, which is obtained by repeating step IV for the second time in step V according to this embodiment. It can be seen that the curves of the drain currents varying as the fourth drain voltage $Vd4$ varies, which are obtained by repeating step IV two times, are both consistent with the curve of the second leakage current $Id2$ varying as the fourth drain voltage $Vd4$ varies in step IV. That is, upon multiple times of repeated monitoring, it is verified that the second leakage current Id2 obtained in step IV is reduced when the drain voltage is greater than 8 V, i.e., when the third drain voltage Vd3 in step III and the fourth drain voltage Vd4 in step IV of this example are each set at 8 V, the first leakage current Id1 is equal to the second leakage current Id2, both being 1E-11 A. That is, step IV reduces the trap charges in the IO device on the basis of step III, thereby reducing the final leakage current. Under a normal operating voltage, the leakage current of the IO device is reduced to an order of 1E-11 A. Compared to that in a conventional test method, the leakage current according to this embodiment is reduced by two orders of magnitude, and reaches a target value.

To sum up, by applying a current effect to the drain of the IO device, the present application restricts the current to act on the IO device continuously, which may effectively eliminate the possible presence of trap electrons in the structure and reduce the leakage current of the IO device, thereby reducing power consumption during use and improving the product yield. Therefore, the present application effectively overcomes various defects in the current technique and has a high industrial utilization value.

The above embodiments merely illustrate the principle and effect of the present application, rather than for limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A test method for improving a yield of an input-output (IO) device, wherein the test method at least comprises:

step I, providing a metal-oxide-semiconductor (MOS) transistor on the IO device, wherein the MOS transistor has a gate, a source, a drain, and a base, wherein the IO device is arranged to apply a variable gate voltage, a variable source voltage, a variable drain voltage, and a variable base voltage to the gate, source, drain, and base of the MOS transistor respectively, and to detect a variation in a drain current at the drain of the MOS transistor;

applying, by the IO device, a gradually increasing first gate voltage to the gate of the MOS transistor, wherein the first gate voltage varies with a step of 0.1 V, and wherein the first gate voltage varies in a range from −2 V to 8 V; and applying, by the IO device, a first drain voltage of about 0.05 V to the drain of the MOS transistor;

step II, reapplying, by the IO device, a gradually increasing second gate voltage to the gate of the MOS transistor, wherein the second gate voltage varies with a step of 0.1 V, and wherein the second gate voltage varies in a range from −2 V to 8 V; and reapplying, by the IO device, a second drain voltage of 8 V to the drain of the MOS transistor;

step III, reapplying, by the IO device, a gradually increasing third drain voltage to the drain of the MOS transistor, wherein the third drain voltage varies with a step of 0.04 V, and wherein the third drain voltage varies in a range from 0 V to 14 V; and detecting from the IO device a variation of a drain current that occurs as the third drain voltage varies, wherein the drain current detected from the IO device is a first leakage current; and step IV, reapplying, by the IO device, a gradually increasing fourth drain voltage to the drain of the MOS transistor, wherein the fourth drain voltage varies with a step of 0.04 V, and wherein the fourth drain voltage varies in a range from 0 V to 14 V; and detecting from the IO device a variation of the drain current that occurs as the fourth drain voltage varies, wherein the drain current detected from the IO device is a second leakage current, wherein when variation ranges of the fourth drain voltage and the third drain voltage provided by the IO device are each set at greater than 8 V and less than 12 V, and the second leakage current detected at the drain from the IO device under the fourth drain voltage is less than the first leakage current detected at the drain from the IO device under the third drain voltage.

2. The test method for improving the yield of the IO device according to claim 1, wherein the source voltage and the base voltage of the MOS transistor in step I are each set at 0 V.

3. The test method for improving the yield of the IO device according to claim 1, wherein the source voltage and the base voltage of the MOS transistor in step II are each set at 0 V.

4. The test method for improving the yield of the IO device according to claim 1, wherein a damaging threshold value of the drain current of the MOS transistor in step III is 1E-6 ($1\times10^{-6}$) A.

5. The test method for improving the yield of the IO device according to claim 1, wherein the source voltage, the base voltage, and the gate voltage of the MOS transistor in step III are each set at 0 V.

6. The test method for improving the yield of the IO device according to claim 1, wherein a damaging threshold value of the drain current of the MOS transistor in step IV is 1E-6 ($1\times10^{-6}$) A.

7. The test method for improving the yield of the IO device according to claim 1, wherein, when the third drain voltage in step III and the fourth drain voltage in step IV are each set at 8 V, the first leakage current is equal to the second leakage current, both being 1E-11 ($1\times10^{-11}$) A.

8. The test method for improving the yield of the IO device according to claim 1, wherein the test method further comprises step V: repeating step IV multiple times, so as to obtain the drain current that varies in consistency with the second leakage current.

* * * * *